United States Patent
Kuo

(10) Patent No.: US 6,598,667 B1
(45) Date of Patent: Jul. 29, 2003

(54) HEAT DISPENSING DEVICE FOR ELECTRONIC PARTS

(76) Inventor: Yung-Pin Kuo, No. 55, Alley 121, Lane 175, Kuo Shen Rd, Chang Hwa City (TW)

(*) Notice: Subject to any disclaimer, the term of this patent is extended or adjusted under 35 U.S.C. 154(b) by 0 days.

(21) Appl. No.: 10/178,354

(22) Filed: Jun. 25, 2002

(30) Foreign Application Priority Data

Jan. 14, 2002 (TW) ...................................... 91200384 U

(51) Int. Cl.⁷ ................................................ H05K 7/20
(52) U.S. Cl. ...................... 165/80.3; 165/121; 361/697; 361/704
(58) Field of Search ................ 165/80.3, 121; 361/704, 697; 174/16.3; 257/719, 722

(56) References Cited

U.S. PATENT DOCUMENTS

| 4,823,869 | A | * | 4/1989 | Arnold et al. | ............... 165/185 |
| 6,327,148 | B1 | * | 12/2001 | Tucker et al. | ............... 361/704 |
| 6,382,306 | B1 | * | 5/2002 | Hsu | ........................... 165/80.3 |

* cited by examiner

Primary Examiner—Allen Flanigan
(74) Attorney, Agent, or Firm—Rosenberg, Klein & Lee

(57) ABSTRACT

A heat dispensing device includes a base with a protruding central ridge and two inclined top surfaces are respectively connected to two sides of the central ridge and slope outward from the protruding central ridge. A plurality of heat dispensing plates extend from each of the inclined top surfaces and a fan is located above heat dispensing plates. The air streams will bounce outward when striking the inclined surfaces and efficiently remove the heat out from the base and plates.

3 Claims, 4 Drawing Sheets

HEAT DISPENSING DEVICE FOR ELECTRONIC PARTS

FIELD OF THE INVENTION

The present invention relates to a heat dispensing device for removing heat generated by an electronic part such as a CPU of a computer and the device has inclined surfaces on which fins or plates are connected so that the air stream bounces inclinedly and outward when striking the surfaces and does not reduce the wind pressure.

BACKGROUND OF THE INVENTION

A conventional heat dispensing device for an electronic part is shown in FIGS. 5 and 6, and generally includes a base 40 which is fixed on a board (not shown) and a groove 41 is defined in a top surface of the base 40 so that the base 40 can be fixed to the board by a clamping member 15. A plurality of heat dispensing fins or plates 42 are connected to the horizontal surfaces 43 of the base 40 and a fan 50 is located above the heat dispensing fins or plates 42. The fan 50 blows air into the gaps between the plates 42 so as to remove the heat generated by the electronic part. The air streams strike the horizontal surfaces 43 perpendicularly and then bounce upward to hit with the following air streams coming into the gaps between the plates 42. This generates turbulence flow and reduces the wind pressure which is the main character to remove the heat out from the gaps.

The present invention intends to provide a heat dispensing device that has inclined surfaces so as to guide the air streams to bounce outward and inclinedly to increase the efficiency of heat dispensing.

SUMMARY OF THE INVENTION

In accordance with one aspect of the present invention, there is provided a heat dispensing device which comprises a base having two inclined top surfaces which slope outward from a central protruding ridge and a plurality of heat dispensing plates extend from the inclined top surface with gaps defined between the heat dispensing plates. A fan is located above heat dispensing plates.

The primary object of the present invention is to provide a heat dispensing device that has inclined top surfaces on the base so as to guide the air streams outward and not to reduce the wind pressure onto the base.

The present invention will become more obvious from the following description when taken in connection with the accompanying drawings which show, for purposes of illustration only, a preferred embodiment in accordance with the present invention.

DETAILED DESCRIPTION OF THE PREFERRED MBODIMENTS

Figure 1:
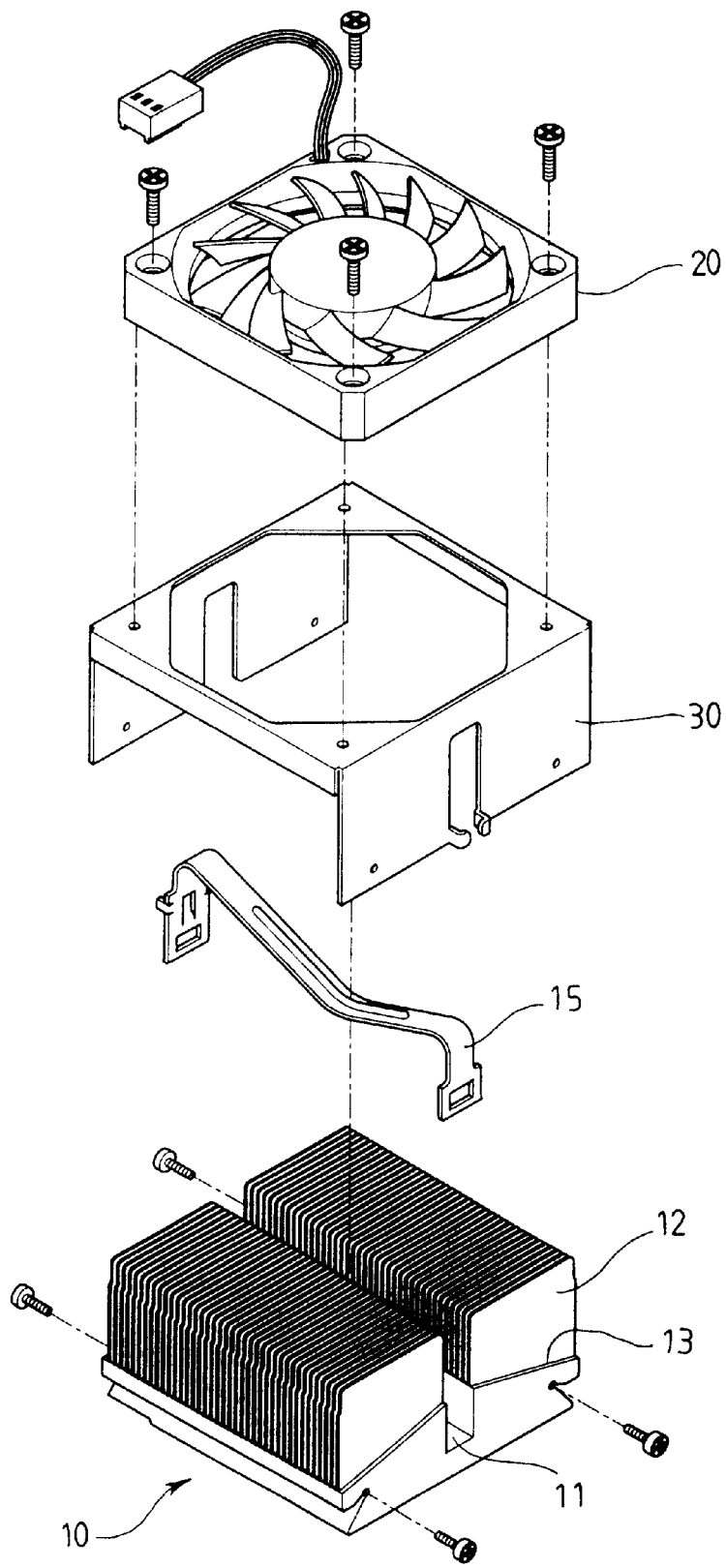
FIG. 1 is an exploded view to show the heat dispensing device of the present invention.
Figure 6:
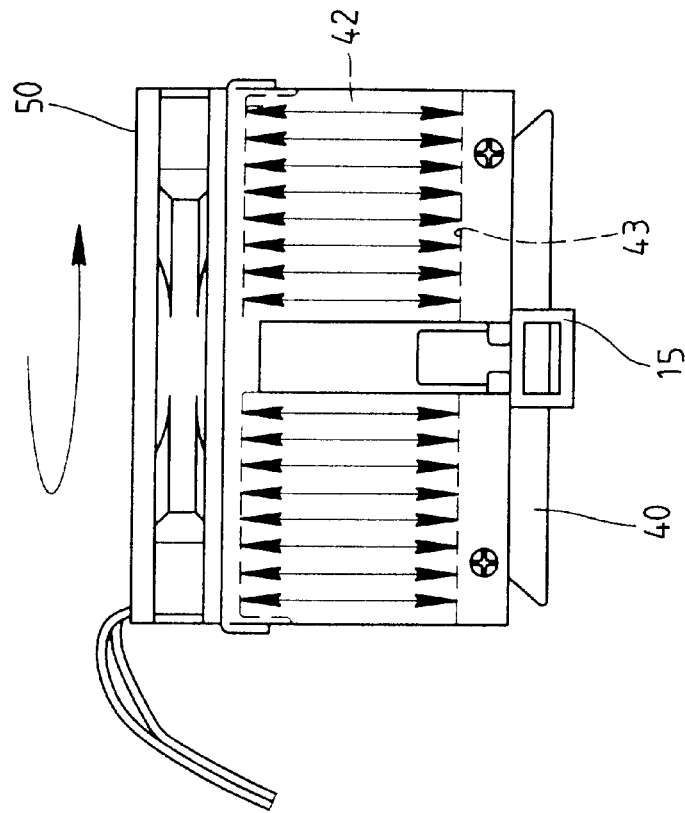
FIG. 6 shows that the air streams entering the gaps between the plates are exactly in opposite to the air streams bouncing back from the top surface of the base of the conventional heat dispensing device.
Figure 2:
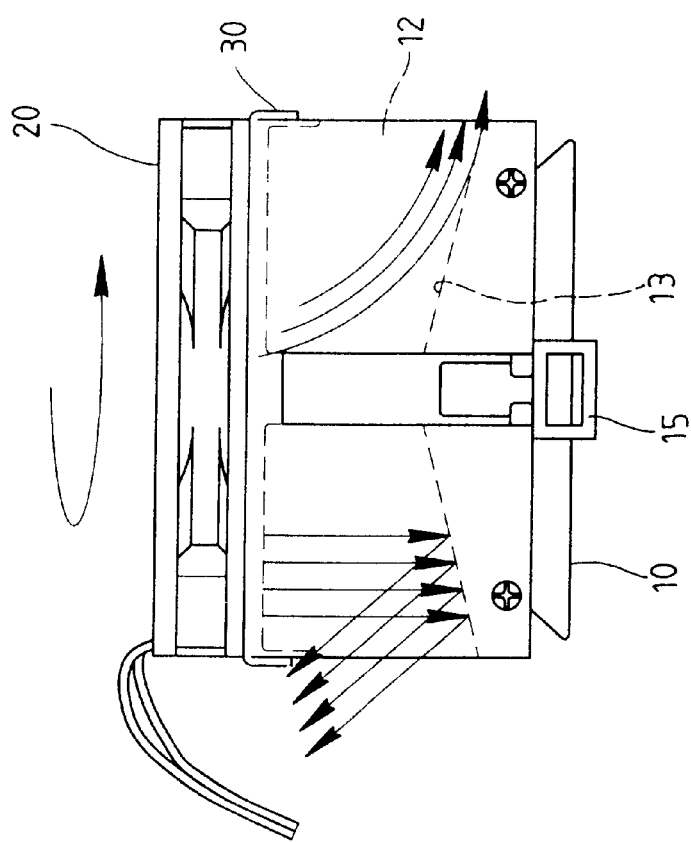
FIG. 2 shows the air streams bounce outward from the inclined top surfaces of the heat dispensing device of the present invention.
Figure 5:
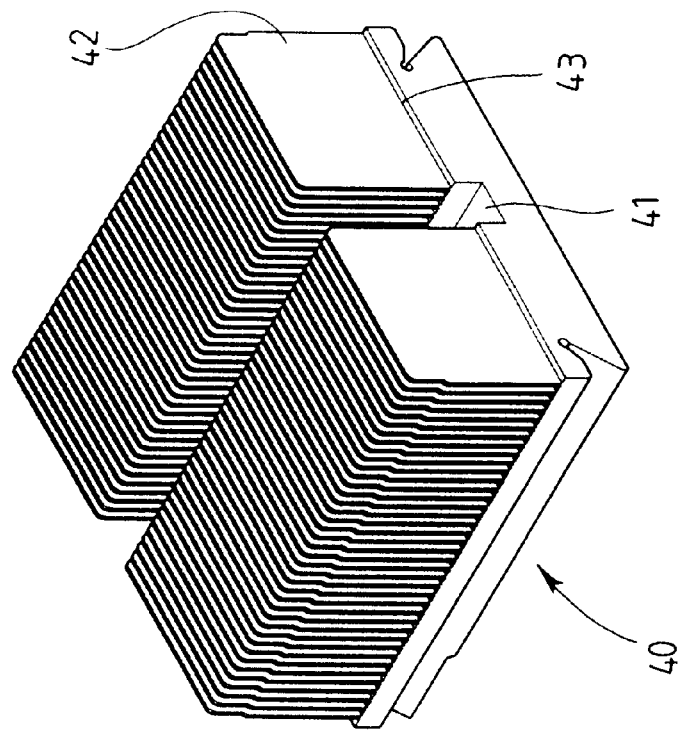
FIG. 5 is a perspective view to show a conventional heat dispensing device.

Referring to FIGS. 1 and 2, the heat dispensing device of the present invention comprises a base 10 which has a protruding central ridge and two inclined top surfaces 13 are respectively connected to two sides of the central ridge. The two inclined top surfaces 13 slope outward from the protruding central ridge and a plurality of heat dispensing plates 12 extend from each of the inclined top surfaces 13 and gaps are defined between the heat dispensing plates 12.

A groove 11 is defined in the protruding central ridge and a clamping member 15 is engaged with the groove 11 so as to fix the base 10 to a board (not shown). The way of fixing the base 10 may varies according to practical needs such as tow clamping members connected to two sides of the base 10. The number of the top inclined surface 13 may also be only one or more than two.

A fan 20 is located above heat dispensing plates 12 and connected to a frame 30 mounted onto the base 10. The air streams generated from the fan 30 blows into the gaps and then bounce inclined and outward to remove the heat away from the base 10 and the plates 12. The direction that the air streams bouncing from the top inclined surfaces 13 is different from that of the air streams entering the gaps so that the heat can be efficiently removed and the wind pressure onto the, base 10 is not reduced as described for the conventional heat dispensing device.

Figure 3:
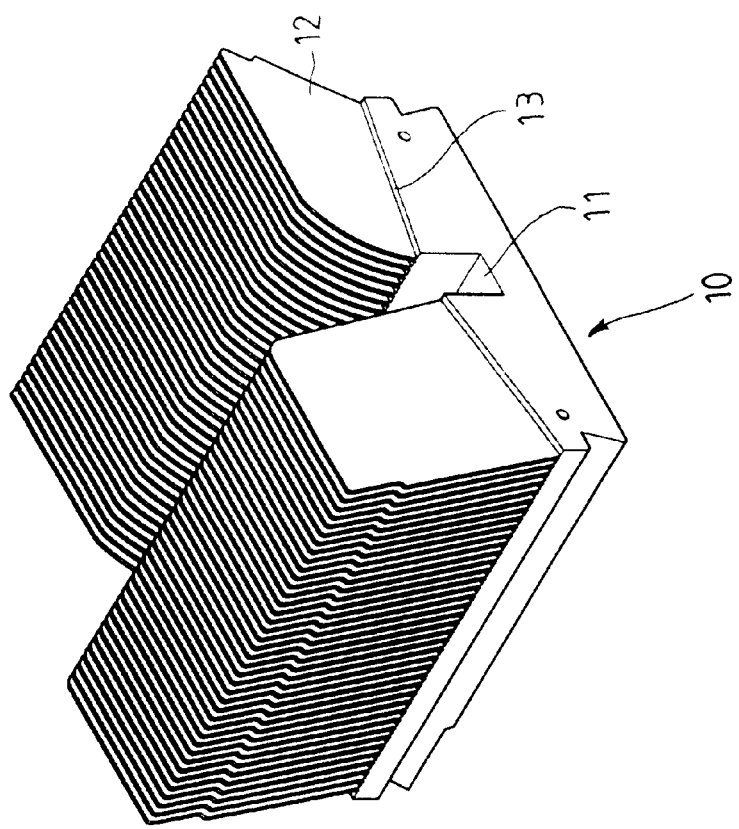
FIG. 3 is a perspective view to show another embodiment of the heat dispensing device of the present invention.

FIG. 3 shows that the heat dispensing plates 12 each have an inclined top edge which has a lower end close to the central protruding ridge of the base 10 and a higher end located on the opposite end of the lower end. This arrangement has a wider area for the air streams entering the gaps between the plates 12.

Figure 4:
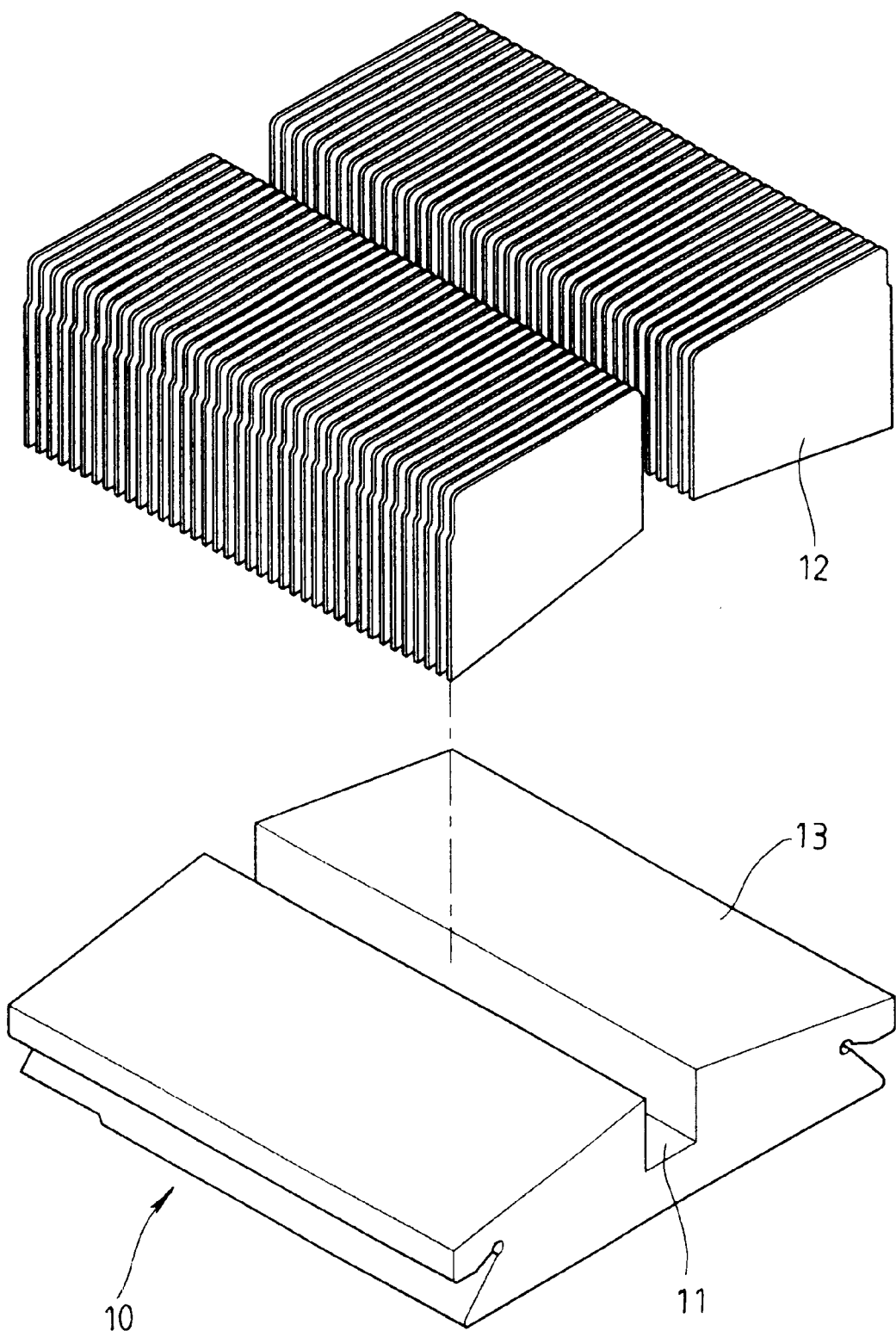
FIG. 4 shows that the plates and the base are made separately and the plates may be welded to the base.

FIG. 4 shows that the plates 12 and the base 10 are made separately and the plates 12 may be welded to the base 10. The plates 12 and the base 10 may also to be integrally made in one-piece.

While we have shown and described the embodiment in accordance with the present invention, it should be clear to those skilled in the art that further embodiments may be made without departing from the scope of the present invention.

What is claimed is:

1. A heat dispensing device comprising:

a base having an inclined top surface;

a plurality of heat dispensing plates extending from the inclined top surface of said base and having gaps formed between the heat dispensing plates, the heat dispensing plates each have an inclined top edge; and, a fan located above the plurality of heat dispensing plates.

2. A heat dispensing device comprising:

a base having a protruding central ridge and two inclined top surfaces respectively connected to two sides of the protruding central ridge, the two inclined top surfaces sloping outward from the protruding central ridge, the base having a groove defined in the protruding central ridge;

a plurality of heat dispensing plates extending from each of the inclined top surfaces and having gaps formed between the heat dispensing plates;

a fan located above the plurality of heat dispensing plates; and, a clamping member engaged with the groove.

3. A heat dispensing device comprising:

a base having a protruding central ridge and two inclined top surfaces respectively connected to two sides of the protruding central ridge, the two inclined top surfaces sloping outward from the protruding central ridge;

a plurality of heat dispensing plates extending from each of the inclined top surfaces and having gaps formed between the heat dispensing plates, the heat dispensing plates each having an inclined top edge; and, a fan located above the plurality of heat dispensing plates.

* * * * *